US012648248B2

(12) United States Patent
Shin

(10) Patent No.: US 12,648,248 B2
(45) Date of Patent: Jun. 2, 2026

(54) IMAGE SENSING DEVICE

(71) Applicant: SK hynix Inc., Icheon-si (KR)

(72) Inventor: Jong Hwan Shin, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 676 days.

(21) Appl. No.: 17/993,367

(22) Filed: Nov. 23, 2022

(65) Prior Publication Data

US 2023/0335571 A1    Oct. 19, 2023

(30) Foreign Application Priority Data

Apr. 18, 2022    (KR) ........................ 10-2022-0047571

(51) Int. Cl.
H10F 39/00                (2025.01)

(52) U.S. Cl.
CPC ....... H10F 39/807 (2025.01); H10F 39/8037 (2025.01)

(58) Field of Classification Search
CPC .... H10F 39/807; H10F 39/8037; H10F 39/18; H10F 39/802; H10F 39/80373; H10F 39/813
See application file for complete search history.

(56) References Cited

U.S. PATENT DOCUMENTS

| | | | | |
|---|---|---|---|---|
| 9,054,007 B2 * | 6/2015 | Hu | | H10F 39/199 |
| 10,790,326 B2 * | 9/2020 | Takahashi | | H01L 21/02639 |
| 2012/0199894 A1 * | 8/2012 | Furuya | | H10F 39/802 |
| | | | | 257/292 |

| | | | | |
|---|---|---|---|---|
| 2016/0093651 A1 * | 3/2016 | Sato | | H10F 39/8023 |
| | | | | 257/229 |
| 2017/0162623 A1 * | 6/2017 | Ogawa | | H10F 39/802 |
| 2017/0317117 A1 * | 11/2017 | Ukigaya | | H10F 39/8063 |
| 2021/0074747 A1 * | 3/2021 | Takahashi | | H10F 39/802 |
| 2021/0118924 A1 * | 4/2021 | Tamaki | | H10F 39/8063 |
| 2021/0143202 A1 | 5/2021 | Lee et al. | | |

FOREIGN PATENT DOCUMENTS

| | | |
|---|---|---|
| KR | 20200035821 A | 4/2020 |

OTHER PUBLICATIONS

Request for the Submission of an Opinion for KR Appl. No. 10-2022-0047571, mailed on Nov. 17, 2025, 17 pages with English translation.

* cited by examiner

*Primary Examiner* — Yasser A Abdelaziez
(74) *Attorney, Agent, or Firm* — Perkins Coie LLP

(57)                ABSTRACT

An image sensing device includes a photoelectric conversion element disposed in a substrate and configured to convert incident light into photocharges indicative of the incident light, a plurality of transistors structured to process the photocharges generated by the photoelectric conversion element, a first isolation structure disposed adjacent to one side of the photoelectric conversion element and structured to vertically extend from a first surface of the substrate to a first depth, and a second isolation structure disposed adjacent to another side of the photoelectric conversion element and structured to extend from the first surface to a second depth, wherein the first depth is greater than the second depth, and wherein the first isolation structure is disposed to overlap a gate electrode of at least one of the plurality of transistors.

12 Claims, 5 Drawing Sheets

IMAGE SENSING DEVICE

CROSS-REFERENCE TO RELATED APPLICATION

This patent document claims the priority and benefits of Korean patent application No. 10-2022-0047571, filed on Apr. 18, 2022, the disclosure of which is incorporated herein by reference in its entirety as part of the disclosure of this patent document.

TECHNICAL FIELD

The technology and implementations disclosed in this patent document generally relate to an image sensing device including image sensing pixels capable of generating electrical signals corresponding to the intensity of incident light.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing having improved noise characteristics.

In some embodiments of the disclosed technology, an image sensing device may include a photoelectric conversion element disposed in a substrate and configured to convert incident light into photocharges indicative of the incident light, a plurality of transistors structured to process the photocharges generated by the photoelectric conversion element, a first isolation structure disposed adjacent to one side of the photoelectric conversion element and structured to vertically extend from a first surface of the substrate to a first depth, and a second isolation structure disposed adjacent to another side of the photoelectric conversion element and structured to extend from the first surface to a second depth, wherein the first depth is greater than the second depth, and wherein the first isolation structure is disposed to overlap a gate electrode of at least one of the plurality of transistors.

In some embodiments of the disclosed technology, an image sensing device may include a photoelectric conversion element disposed in a substrate, and configured to convert incident light into photocharges corresponding to the incident light, a first isolation structure disposed to overlap a gate electrode of a transistor for processing the photocharges and structured to vertically extend from a first surface of the substrate to a first depth, and a second isolation structure disposed on an opposite side of the first isolation structure with respect to the photoelectric conversion element, and structured to vertically extend from the first surface to a second depth, wherein the first depth is greater than the second depth, and wherein the incident light is incident upon the substrate through the first surface.

In some embodiments of the disclosed technology, an image sensing device may include a photoelectric conversion element disposed in a substrate and configured to generate photocharges corresponding to incident light, a first isolation structure disposed at one side of the photoelectric conversion element and configured to extend from a first surface of the substrate by a first depth, and a second isolation structure disposed at the other side of the photoelectric conversion element and configured to extend from the first surface by a second depth. The first depth may be greater than the second depth. The first isolation structure may be disposed to overlap a gate of at least one of a plurality of transistors for processing the photocharges generated by the photoelectric conversion element.

In some embodiments of the disclosed technology, an image sensing device may include a photoelectric conversion element disposed in a substrate, and configured to generate photocharges corresponding to incident light; a first isolation structure disposed to overlap a gate of a transistor for processing the photocharges, and configured to extend from a first surface of the substrate by a first depth; and a second isolation structure disposed on an opposite side of the first isolation structure with respect to the photoelectric conversion element, and configured to extend from the first surface by a second depth. The first depth may be greater than the second depth, and the incident light may be incident upon the substrate through the first surface.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device including pixels capable of generating electrical signals corresponding to the intensity of incident light, that may be used in configurations to substantially address one or more technical or engineering issues and to mitigate limitations or disadvantages encountered in some other image sensing devices. Some implementations of the disclosed technology relate to an image sensing device having improved noise characteristics. The disclosed technology provides various implementations of an image sensing device that can improve the signal-to-noise ratio (SNR) of a pixel signal by reducing noise generated in a miniaturized pixel.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
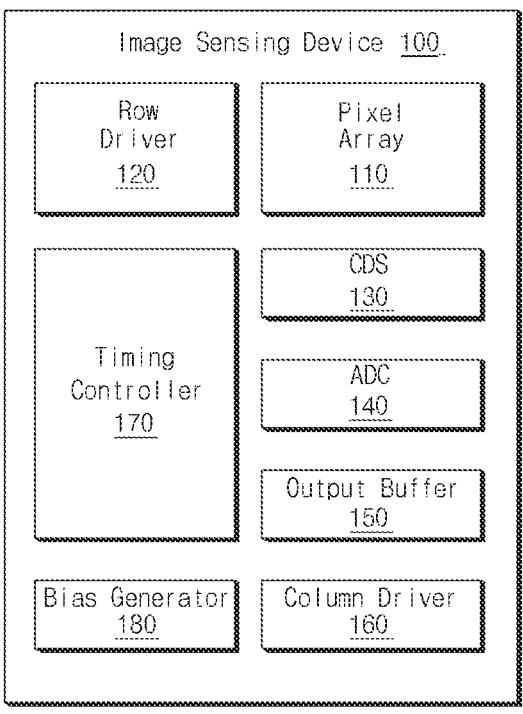
FIG. 1 is a block diagram illustrating an example of an image sensing device based on some implementations of the disclosed technology.

FIG. 1 is a block diagram illustrating an image sensing device 100 according to an embodiment of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160, and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of pixels arranged in rows and columns. In one example, the plurality of pixels can be arranged in a two dimensional pixel array including rows and columns. In another example, the plurality of unit imaging pixels can be arranged in a three dimensional pixel array. The plurality of pixels may convert an optical signal into an electrical signal on a pixel basis or a pixel group basis, where pixels in a pixel group share at least certain internal circuitry. The pixel array 110 may receive driving signals, including a row selection signal, a pixel reset signal and a transmission signal, from the row driver 120. Upon receiving the driving signal, corresponding pixels in the pixel array 110 may be activated to perform the operations corresponding to the row selection signal, the pixel reset signal, and the transmission signal.

The row driver 120 may activate the pixel array 110 to perform certain operations on the pixels in the corresponding row based on commands and control signals provided by controller circuitry such as the timing controller 170. In some implementations, the row driver 120 may select one or more pixels arranged in one or more rows of the pixel array 110. The row driver 120 may generate a row selection signal to select one or more rows among the plurality of rows. The row driver 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of a pixel (e.g., floating diffusion node) is reset, and the image signal may be an electrical signal that is provided to the CDS 130 when photocharges generated by the pixel are accumulated in the sensing node. The reference signal indicating unique reset noise of each pixel and the image signal indicating the intensity of incident light may be generically called a pixel signal as necessary.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of at least one of the row driver 120, the ADC 140, the output buffer 150, and the column driver 160.

The timing controller 170 may provide the row driver 120, the CDS 130, the ADC 140, the output buffer 150, and the column driver 160 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

The bias generator 180 may generate a bias voltage for suppressing a dark current that would have been generated in a pixel of the pixel array 110 by applying the bias voltage to the pixel array 110, as will be discussed below with reference to FIG. 5.

The bias voltage may be determined by performing a wafer probe test process of the image sensing device 100 and stored in a one-time programmable memory (OTP) memory. For example, the bias voltage may be experimentally determined in a way that can avoid unnecessary power consumption and maximize the dark current suppression without deteriorating performance of the image sensing device 100.

The bias generator 180 may generate a voltage corresponding to a bias voltage stored in the OTP memory. In some implementations, the OTP memory may be included in the image sensing device 100. In one example, the OTP memory may be included in the bias generator 180.

In some implementations, the bias voltage may include a plurality of voltage values.

For example, the plurality of voltage values may correspond to a plurality of operation modes of the image sensing device 100, respectively. A dark current generated under a low-luminance condition may be different from a dark current generated in a high-luminance level. In order to effectively suppress the dark current in each environment, a bias voltage provided from the bias generator 180 may vary depending on the operation mode.

Alternatively, the plurality of values may correspond to the plurality of regions of the pixel array 110, respectively. The dark currents generated due to the positions of the respective pixels in the pixel array 110 may be different from each other. In order to effectively suppress the dark current regardless of the position of each pixel, the bias voltage generated by the bias generator 180 may vary depending on the respective regions.

In some implementations, the bias voltage may be a negative voltage.

Figure 2:
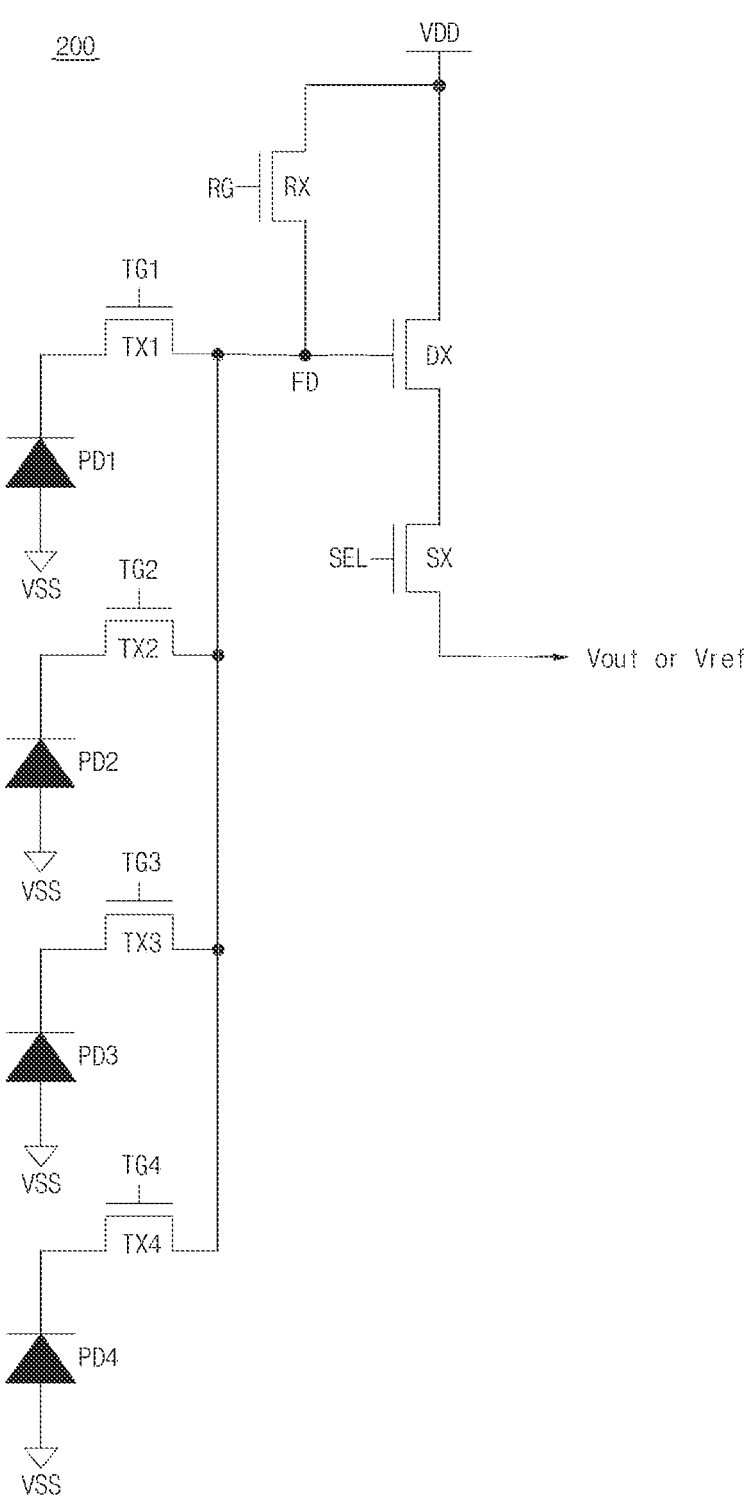
FIG. 2 is a circuit diagram illustrating an example of a pixel group included in the pixel array shown in FIG. 1 based on some implementations of the disclosed technology.

FIG. 2 is a circuit diagram illustrating an example of a pixel group included in the pixel array shown in FIG. 1 based on some implementations of the disclosed technology.

Referring to FIG. 2, the pixel group 200 may include at least one pixel. In some implementations, the pixel group 200 may include four pixels. In other implementations, the pixel group 200 may include less than, or more than, four pixels. A plurality of pixel groups 200 may be repeatedly arranged in a predetermined direction (row direction and/or column direction) in the pixel array 110 of FIG. 1.

The pixel group 200 may have a shared pixel structure in which four pixels corresponding to the photoelectric conversion elements PD1-PD4 share at least one transistor. In one example, the at least one transistor shared by a plurality of pixels can include transfer transistors TX1-TX4, a reset transistor RX, a drive transistor DX, and/or a selection transistor SX.

An equivalent circuit of the pixel group 200 may include photoelectric conversion elements PD1-PD4, transfer transistors TX1-TX4, a reset transistor RX, a drive transistor DX, and a selection transistor SX. A 4TR (i.e., four-transistor) structure is depicted in FIG. 2 by way of example only. In other implementations, each pixel group 200 may include less than, or more than, four pixels (3TR structure, 5TR structure, etc.). In other implementations, each pixel may include its own transistor without sharing transistors (e.g., transfer transistors TX1-TX4, a reset transistor RX, a drive transistor DX, and a selection transistor SX).

Each of the first to fourth photoelectric conversion elements PD1-PD4 may generate and accumulate photocharges corresponding to the intensity of incident light (e.g., the amount of incident light rays). One end of each of the first to fourth photoelectric conversion elements PD1-PD4 may be coupled to a source voltage (VSS), and the other end of each of the first to fourth photoelectric conversion elements PD1-PD4 may be coupled to any one of the first to fourth transfer transistors TX1-TX4. In one example, the source voltage (VSS) may be a ground voltage. Each of the first to fourth photoelectric conversion elements PD1-PD4 may also be implemented as a photodiode, a phototransistor, a photogate, a pinned photodiode or a combination of two or more of photodiode, phototransistor, photogate, and pinned photodiode.

The first transfer transistor TX1 may be coupled between the photoelectric conversion element PD1 and the floating diffusion node FD. The second transfer transistor TX2 may be coupled between the photoelectric conversion element PD2 and the floating diffusion node FD. The third transfer transistor TX3 may be coupled between the photoelectric conversion element PD3 and the floating diffusion node FD. The fourth transfer transistor TX4 may be coupled between the photoelectric conversion element PD4 and the floating diffusion node FD. Each of the first to fourth transfer transistors TX1-TX4 may be turned on or off in response to a transmission control signal TG, so that each of the turned-on first to fourth transfer transistors TX1-TX4 may transmit photocharges accumulated in any one of the first to fourth photoelectric conversion elements PD1-PD4 to the floating diffusion node FD. A first time interval in which the first transfer transistor TX1 is turned on, a second time interval in which the second transfer transistor TX2 is turned on, a third time interval in which the third transfer transistor TX3 is turned on, and a fourth time interval in which the fourth transfer transistor TX4 is turned on may be sequentially activated in a specific order without overlapping each other. In another embodiment, at least two of the first to fourth time intervals may be identical to each other or may at least partially overlap each other.

The floating diffusion node FD may receive, through the first to fourth transfer transistors TX1-TX4, photocharges generated by the first to fourth photoelectric conversion elements PD1-PD4, and may accumulate the received photocharges. For example, the floating diffusion node FD may include a region having a predetermined capacitance such that a voltage or electric potential may vary depending on the amount of accumulated photocharges. In some implementations, the floating diffusion node FD may include a junction capacitor.

The reset transistor RX may be coupled between a drain voltage (VDD) terminal and the floating diffusion node FD, and may reset a voltage or electric potential of the floating diffusion node FD to the drain voltage VDD in response to a pixel reset signal RG. In some implementations, the drain voltage VDD may be a power-supply voltage.

The drive transistor DX may transmit, to the selection transistor SX, an electrical signal corresponding to a voltage or electric potential of the floating diffusion node FD that has received the photocharges accumulated in the first to fourth photoelectric conversion elements PD1-PD4. In other words, the drive transistor DX may operate as a source follower transistor.

The selection transistor SX may select at least one pixel and may read out data on a row basis. For example, data can be read out from the pixels on a page basis. The selection transistor SX may be turned on by a selection control signal SEL, so that the electrical signal corresponding to the electric potential of the floating diffusion node FD and provided to the selection transistor SX can be output as an output voltage Vout or Vref or a pixel signal.

The output voltage Vout or Vref of the selection transistor SX may correspond to a reference signal (e.g., a signal corresponding to the voltage at the reset floating diffusion node FD) depicted in FIG. 1 and an image signal (e.g., a signal corresponding to the voltage at the floating diffusion node FD in which photocharges received from the photoelectric conversion element PD are accumulated).

Figure 3:
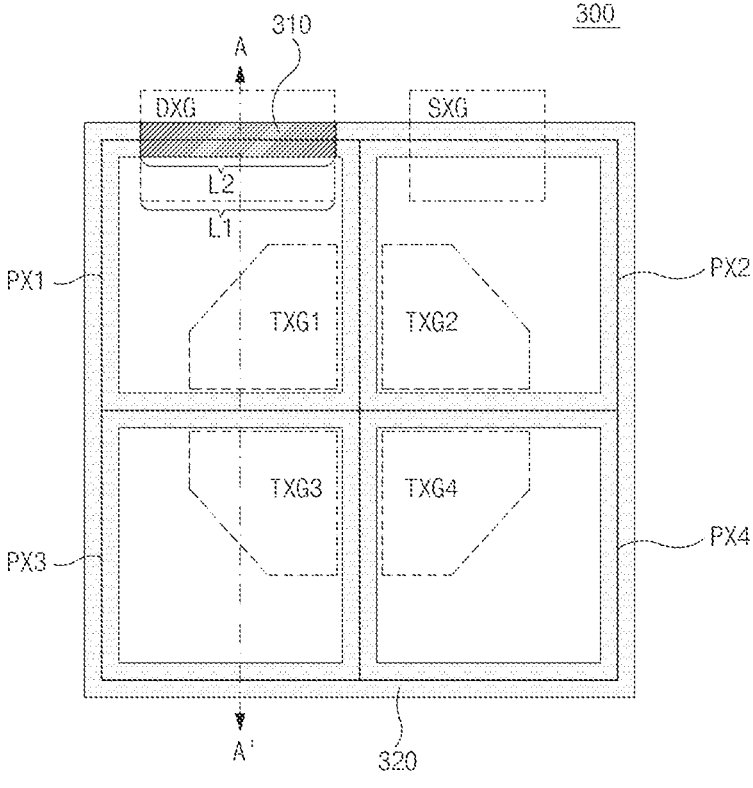
FIG. 3 is a schematic diagram illustrating an example of a portion of the pixel array shown in FIG. 1 based on some implementations of the disclosed technology.

FIG. 3 is a schematic diagram illustrating an example of a portion of the pixel array shown in FIG. 1 based on some implementations of the disclosed technology.

A portion 300 of the pixel array 110 is shown in FIG. 3, and the portion 300 of the pixel array 110 may correspond to the pixel group 200 shown in FIG. 2. That is, the portion 300 of the pixel array 110 may be repeatedly arranged in a predetermined direction (a row direction and/or a column direction) to configure the pixel array 110.

The portion 300 of the pixel array 110 may include first to fourth pixels PX1-PX4 arranged in a (2×2) matrix or matrix array.

Referring to FIGS. 2 and 3, the first pixel PX1 may include the photoelectric conversion element PD1 and the transfer transistor TX1. The second pixel PX2 may include the photoelectric conversion element PD2 and the transfer transistor TX2. The third pixel PX3 may include the photoelectric conversion element PD3 and the transfer transistor TX3. The fourth pixel PX4 may include the photoelectric conversion element PD4 and the transfer transistor TX4. FIG. 3 shows gates TXG1-TXG4 of the transfer transistors TX1-TX4. The gate TXG1 of the transfer transistor TX1, the gate TXG2 of the transfer transistor TX2, the gate TXG3 of the transfer transistor TX3, and the gate TXG4 of the transfer transistor TX4 are depicted in FIG. 3.

The floating diffusion node (FD of FIG. 2) electrically connected to the transfer transistors of the first to fourth pixels PX1-PX4 may be disposed at the center of the first to fourth pixels PX1-PX4.

The plurality of transistors (RX, DX, and SX of FIG. 2) directly or indirectly connected to the floating diffusion node (FD of FIG. 2) may be disposed in at least a portion of a boundary between the first to fourth pixels PX1-PX4 and other pixels adjacent to the first to fourth pixels PX1-PX4.

In the example of FIG. 3, the gate DXG of the drive transistor DX may be disposed to overlap a boundary between the first pixel PX1 and a pixel (not shown) disposed above the first pixel PX1, and the gate SXG of the selection transistor SX may be disposed to overlap a boundary between the second pixel PX2 and a pixel (not shown) disposed above the second pixel PX2. The gate DXG of the drive transistor DX may be electrically connected to the floating diffusion node, and the gate SXG of the selection transistor SX may receive a row selection signal SEL of FIG. 2.

Although not shown, the first terminal and the second terminal of the drive transistor DX may be disposed to overlap at least a portion of the gate DXG of the drive transistor DX, the first terminal may receive the drain voltage VDD, and the second terminal may be electrically connected to the selection transistor SX.

In addition, a third terminal and a fourth terminal of the selection transistor SX may be disposed to overlap at least a portion of the gate SXG of the selection transistor SX, the third terminal may be electrically connected to the drive transistor DX, and the fourth terminal may be electrically connected to a signal line outputting an output voltage Vout or Vref.

In some implementations, each of the first to fourth terminals may be a region that includes impurities having a specific conductivity type disposed at one surface of a semiconductor substrate. In addition, the second terminal and the third terminal may be physically formed in one region.

Although not shown, the gate of the reset transistor RX may be disposed at a boundary between the first to fourth pixels PX1-PX4 and other pixels adjacent to the first to fourth pixels PX1-PX4, or may be disposed outside the first to fourth pixels PX1-PX4.

An isolation structure for isolating each of the first to fourth pixels PX1-PX4 and an adjacent pixel thereof from each other may be disposed at a boundary between each of the first to fourth pixels PX1-PX4 and an adjacent pixel thereof. That is, the isolation structure may be arranged in a grid shape or a mesh shape in which lines extending in a row direction (or a horizontal direction) of the pixel array 110 and lines extending in a column direction (or a vertical direction) of the pixel array 110 are orthogonal to each other. The isolation structure may include a deep trench isolation (DTI) structure formed in a trench that vertically extends from one surface of a substrate (410 of FIG. 4) to a certain depth in the substrate.

The isolation structure may be divided into a first isolation structure 310 and a second isolation structure 320. As shown in FIG. 3, the first isolation structure 310 and the second isolation structure 320 may be arranged continuously and may be spaced apart from each other by a predetermined distance. When the first isolation structure 310 and the second isolation structure 320 are physically spaced apart from each other, a bias voltage applied to the first isolation structure 310 and a bias voltage applied to the second isolation structure may be different from each other. For example, in order to extend the channel region 440 as will be discussed below, the absolute value of the bias voltage applied to the first isolation structure 310 may be greater than the absolute value of the bias voltage applied to the second isolation structure 320. In some embodiments, the bias voltage applied to the first isolation structure 310 may vary depending on time periods and operations the image sensing device 100 is performing. For example, the bias voltage applied to the first isolation structure 310 may have a relatively high absolute voltage value while the drive transistor DX is operating, and may have a relatively low voltage level (e.g., the same voltage level as the bias voltage applied to the second isolation structure 320) while the drive transistor DX is not operating, thereby reducing or minimizing unnecessary power consumption. In other words, the bias voltage applied to the first isolation structure 310 may have a relatively high absolute value when extension of the channel region 440 is required.

The first isolation structure 310 may be disposed in a region overlapping the gate DXG of the drive transistor DX, and the second isolation structure 320 may be disposed in a region other than the region overlapping the gate DXG of the drive transistor DX. Accordingly, the gates of the transfer transistors TX1-TX4, the reset transistor RX, and the selection transistor SX may not overlap the first isolation structure 310. The first isolation structure 310 and the second isolation structure 320 may be arranged to surround the first pixel PX1 together.

Figure 4:
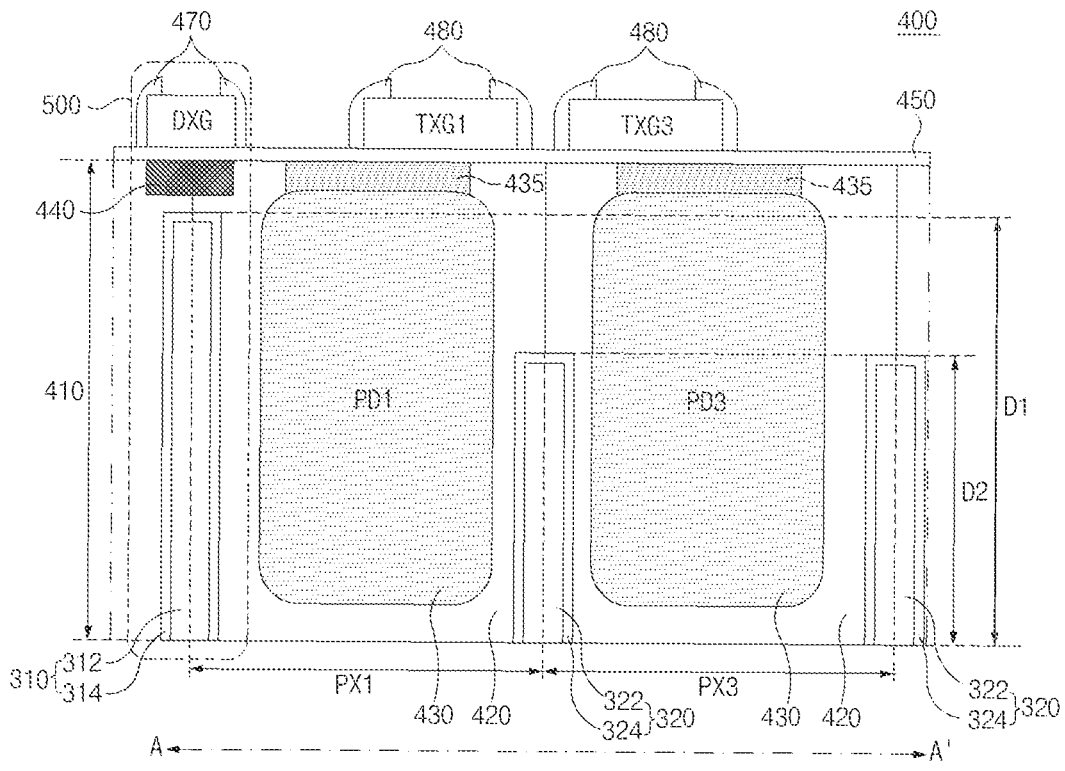
FIG. 4 is a cross-sectional view illustrating an example of the pixel array taken along the line A-A' shown in FIG. 3 based on some implementations of the disclosed technology.

FIG. 4 is a cross-sectional view 400 of the pixel array 110 taken along the line A-A' shown in FIG. 3 based on some implementations of the disclosed technology.

In some implementations, the cross-sectional view 400 may correspond to a cross section of the first pixel PX1 and the third pixel PX3.

The cross-sectional view 400 may include a substrate 410, an insulation layer 450, and a plurality of gates DXG, TXG1, and TXG2.

The substrate 410 may be a semiconductor substrate, and may include a top surface and a bottom surface facing away from each other. In some implementations, the bottom surface of the substrate 410 may be referred to as a front side or a first surface, and the top surface of the substrate 410 may be referred to as a back side or a second surface. The image sensing device 100 may be formed to have a Back Side Illumination (BSI) structure that receives incident light through the back side of the substrate 410. For example, the substrate 410 may be a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate.

The substrate 410 may include an impurity region 420, a photoelectric conversion element 430, a pinning layer 435, a channel region 440, a first isolation structure 310, and a second isolation structure 320.

The impurity region 420 may be a region that is doped with specific conductive impurities (e.g., P-type or N-type impurities). For example, the impurity region 420 may be a P-type or N-type epitaxial layer.

The photoelectric conversion element 430 may include a doped region that is formed by implanting N-type impurities into the substrate 410. In some implementations, the photoelectric conversion element 530 may be formed by stacking a plurality of doped regions having different doping densities. The photoelectric conversion element 430 may have as large an area as possible to increase a fill factor indicating light reception (Rx) efficiency. The photoelectric conversion element 430 may be divided into a photodiode PD1 included in the first pixel PX1 and a photodiode PD3 included in the third pixel PX3.

The pinning layer 435 may be a region that is doped with P+-type impurities at a higher density than the substrate 410 along the surface of the substrate 410, and may be used to suppress occurrence of a dark current. The pinning layer 435 may be formed between the surface of the substrate 410 and the photoelectric conversion element 430. At least a portion of the pinning layer 435 may be formed to overlap the gate TXG1 of the first transfer transistor TX1 or the gate TXG3 of the third transfer transistor TX3.

A dark current may include a flow of electrons generated due to an etching process. Such a dark current may flow along the surface of the substrate 410, thereby generating unintended noise. If the pinned layer 435 is not formed and the photoelectric conversion element 430 is formed in contact with or close to the surface of the substrate 410, photocharges of the photoelectric conversion element 430 may contribute to the generation of dark current, so that noise may occur in the pixel signal. In some implementations, in low-illuminance conditions in which the intensity of incident light or the amount of incident light beams is relatively small, such a dark current may be dominant, resulting in noise in the pixel signal. However, when the pinning layer 435 is formed over the substrate 410, holes of the pinning layer 435 may suppress the flow of electrons corresponding to the dark current.

The channel region 440 may be disposed under the gate DXG of the drive transistor DX to be in contact with the front side of the substrate 410. The channel region 440 may be formed between the first terminal and the second terminal of the drive transistor DX to provide a channel through which signal carriers flow. The channel region 440 may be a region temporarily formed during the operation of the drive transistor DX. In some implementations, when the impurity region 420 is a P-type doped region, each of the first terminal and the second terminal may include N-type impurities. In this case, each of the signal carriers passing through the channel region 440 may include free electrons, and the channel region 440 may correspond to an N-type channel. The length (e.g., horizontal length, L1 in FIG. 3) of the channel region 440 or the gate DXG of the drive transistor DX (e.g., the distance between the first terminal and the second terminal) may be similar to or substantially the same as the length (e.g., horizontal length or width, L2 in FIG. 3) of the first isolation structure 310. In this way, the first isolation structure 310 can extend the area of the channel region 440. In this patent document, it is assumed that the length of the channel region 440 and the length of the gate DXG of the drive transistor DX are substantially equal to each other.

The first isolation structure 310 may include an electrode 312 and an insulation layer 314, and the second isolation structure 320 may include an electrode 322 and an insulation layer 324.

The electrodes 312 and 322 and the insulation layers 314 and 324 may be disposed in a trench (e.g., a backside DTI (BDTI)) that is vertically recessed from one surface (i.e., the back side) of the substrate 410 to a certain depth through the DTI process for the back side of the substrate 410.

The electrodes 312 and 322 may include a conductive material that fills the BDTI in the inner regions of the insulation layers 314 and 324. For example, the electrodes 312 and 322 may include at least one of metal, polysilicon, or doped polysilicon doped with impurities. Further, the electrodes 312 and 322 may be disposed between two pixels adjacent to each other (or may be disposed in a boundary between two pixels).

Each of the electrodes 312 and 322 may receive a negative bias voltage from the bias generator 180. As the negative bias voltage is applied to the electrodes 312 and 322, holes in the impurity region 420 may move to an interface between the BDTI (or the insulation layer 314 or 324) and the impurity region 420, and may be accumulated and fixed. As described above, since holes in the impurity region 420 are accumulated and fixed at the interface between the BDTI (or the insulation layer 314 or 324) and the impurity region 420, flow of the dark current electrons generated from the BDTI surface can be suppressed by the DTI process.

The insulation layer 314 may be disposed between the electrode 312 and the impurity region 420 while being in contact with each of the electrode 312 and the impurity region 420 for electrical isolation between the electrode 312 and the impurity region 420. The insulation layer 324 may be disposed between the electrode 322 and the impurity region 420 while being in contact with each of the electrode 322 and the impurity region 420 for electrical isolation between the electrode 322 and the impurity region 420. The insulation layers 314 and 324 may include an insulation material that has a refractive index different from that of the impurity region 420. That is, the insulation layers 314 and 324 may include an insulation material having a higher refractive index than that of the impurity region 420. For example, each of the insulation layers 314 and 324 may include at least one of a silicon oxide layer, a silicon nitride layer, and a silicon oxynitride layer. The insulation layers 314 and 324 may reduce or minimize optical crosstalk resulting from light that is incident upon one pixel but enters another adjacent pixel for some reasons. In this way, signal-to-noise ratio (SNR) may be reduced.

The first isolation structure 310 including the electrode 312 and the insulation layer 314 (e.g., filled with a material for forming the electrode 312 and a material for forming the insulation layer 314) and the second isolation structure 320 including the electrode 322 and the insulation layer 324 (e.g., filled with a material for forming the electrode 322 and a material for forming the insulation layer 324) may be disposed between adjacent photoelectric conversion elements 430 of adjacent pixels, thereby suppressing the dark current and occurrence of the optical crosstalk.

Although not shown, an optical filter that selectively transmits light in a specific wavelength range, and a microlens that collects or converges incident light may be disposed under the back side of the substrate 410.

As described above, the first isolation structure 310 and the second isolation structure 320, which have similar internal structures, have different vertical length or depth. The depth of the first isolation structure 310 with respect to the back side of the substrate 410 may be different from the depth of the second isolation structure 320 with respect to the back side of the substrate 410. The first isolation structure 310 may extend from the back side of the substrate 410 by a first depth D1, and the second isolation structure 320 may extend from the back side of the substrate 410 by a second depth D2. The first depth D1 may be greater than the second depth D2. Therefore, the distance between the front side of the substrate 410 and the first isolation structure 310 may be less than the distance between the front side of the substrate 410 and the second isolation structure 320. That is, the first isolation structure 310 may be disposed closer to the front side of the substrate 410 than the second isolation structure 320.

The reason why the first isolation structure 310 and the second isolation structure 320 have different depths will be described later with reference to FIG. 5.

On the other hand, in the first pixel PX1, the first isolation structure 310 may be disposed adjacent to one side of the photoelectric conversion element 430 of the first pixel PX1, and the second isolation structure 320 may be disposed adjacent to the other side of the photoelectric conversion element 430 of the first pixel PX1. In other words, the second isolation structure 320 may be disposed at the opposite side of the first isolation structure 310 with respect to the photoelectric conversion element 430 of the first pixel PX1.

In some implementations, the insulation layer 450 may be disposed to cover the front side of the substrate 410. In some implementations, one end of the insulation layer 450 is in contact with the front side of the substrate 410. The insulating layer 450 may electrically isolate the substrate 410 from the gates of the transistors (e.g., TX, RX, DX, and SX) included in the respective pixels. In some implementations, the insulation layer 450 may include at least one of a silicon oxide layer, a silicon nitride layer, or a silicon oxynitride layer.

The plurality of gates DXG, TXG1, and TXG2 may be disposed over the insulation layer 450, and may be electrically isolated from peripheral devices by the corresponding gate insulation regions 470 and 480.

Figure 5:
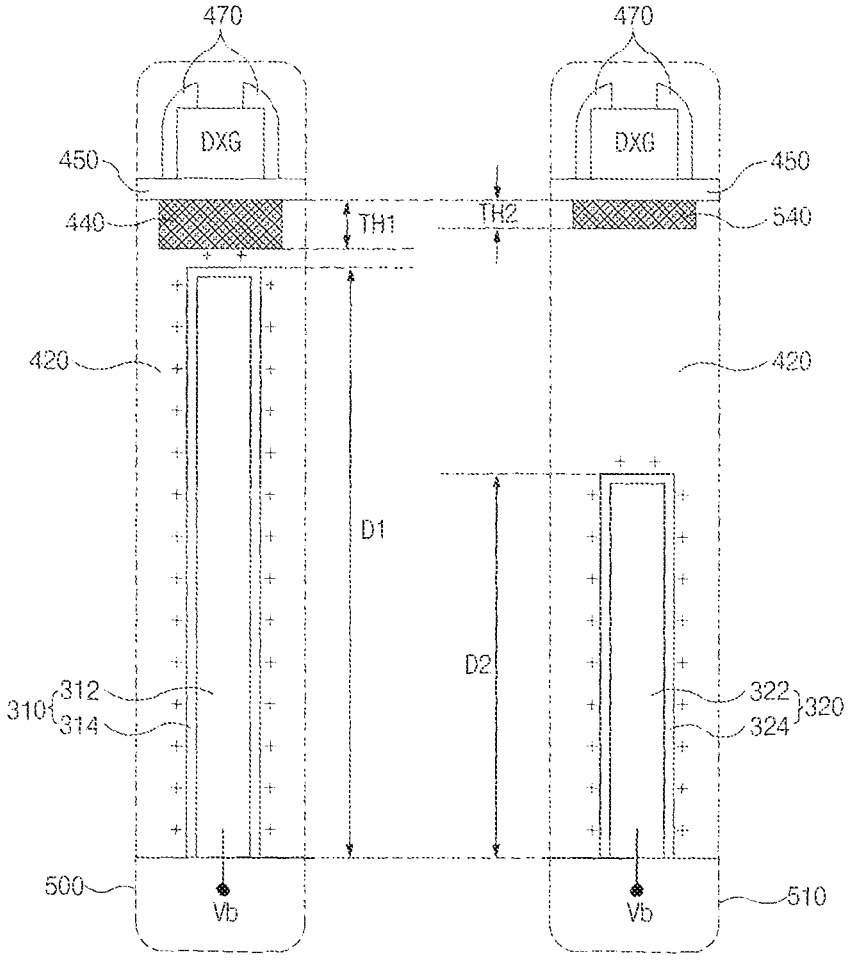
FIG. 5 is a schematic diagram comparing a boundary region shown in FIG. 4 implemented based on some embodiments of the disclosed technology with a boundary region of a comparative example.

FIG. 5 is a schematic diagram comparing a boundary region shown in FIG. 4 implemented based on some embodiments of the disclosed technology with a boundary region of a comparative example.

Referring to FIG. 5, a boundary region 500 shown in FIG. 4 and a boundary region 510 including the second isolation structure 320 instead of the first isolation structure 310 are shown as a comparative example.

The boundary region 500 may be a region corresponding to a boundary between the first pixel PX1 and the adjacent pixel thereof, and may include a gate DXG of the drive transistor DX, a channel region 440, and a first isolation structure 310.

The electrode 312 of the first isolation structure 310 may receive a bias voltage (Vb) provided from the bias generator 180. The bias voltage (Vb) may have a negative (−) polarity, and thus holes in the impurity region 420 may be accumulated and fixed after moving to the interface between the insulation layer 314 and the impurity region 420. The fixed holes (e.g., positive (+) holes of FIG. 5) can affect a thickness of the channel region 440 while suppressing the dark current.

When the drive transistor DX is an n-channel metal-oxide-semiconductor (NMOS) transistor, the channel region 440 may be an N-type channel.

As holes accumulated and fixed on the surface of the first isolation structure 310 has a positive (+) polarity and the first isolation structure 310 is disposed closer to the channel region 440 having a negative (−) polarity, the accumulated and fixed holes on the surface of the first isolation structure 310 may apply attractive force (e.g., coulombic attraction) to the channel region 440. This attractive force may increase the thickness of the channel region 440 so that the channel region 440 may have a first thickness TH1.

The boundary region 510 of the comparative example may include the gate DXG of the drive transistor DX, the channel region 540, and the second isolation structure 320. That is, the second isolation structure 320 of the comparative example may also be disposed under the gate DXG of the drive transistor DX so that the second isolation structure 320 is disposed over the entire pixel array 110.

The electrode 322 of the second isolation structure 320 may receive the bias voltage (Vb) provided from the bias generator 180. The bias voltage (Vb) may have a negative (−) polarity, and thus holes in the impurity region 420 may be accumulated and fixed after moving to the interface between the insulation layer 324 and the impurity region 420. In this case, the fixed holes (i.e., positive (+) holes of FIG. 5) can suppress the dark current.

Since the second isolation structure 320 has a second depth D2 that is smaller than the first depth D1 of the first isolation structure 310, the second isolation structure 320 can hardly apply attractive force to the channel region 540 even if positive (+) holes are accumulated and fixed at the surface of the second isolation structure 320. Thus, the thickness of the channel region 540 may be relatively reduced, and the channel region 540 may have a second thickness TH2 that is less than the first thickness TH1.

The thicknesses TH1 and TH2 of the channel regions 440 and 540 disposed under the gate DXG of the drive transistor DX may be associated with the channel area of the drive transistor DX. That is, as the thicknesses TH1 and TH2 of the channel regions 440 and 540 increase, the channel region of the drive transistor DX may increase in size.

Random telegraph signal (RTS) noise generated in the drive transistor DX may decrease as the current flowing through the drive transistor DX increases.

Since the first thickness TH1 of the channel region 440 is greater than the second thickness TH2 of the channel region 540, the channel region of the channel region 440 may be larger in size than the channel region of the channel region 540. Accordingly, the current flowing through the channel region 440 becomes greater than the current flowing through the channel region 540, so that RTS noise generated in the drive transistor DX of the boundary region 500 may be significantly smaller than RTS noise generated in the drive transistor DX of the boundary region 510.

The DTI structure can reduce or prevent crosstalk between the adjacent pixels. In some cases, however, defects caused by semiconductor fabrication process issues, such as a dangling bond, may increase, for example, during the etching process for forming the DTI structure.

In order to suppress the dark current caused by such defects, a negative (−) bias voltage is applied to the electrodes in the DTI structure as described above. However, as the volume of the DTI structure increases, the volume of the electrodes in the DTI structure may also increase in proportion to this volume of the DTI structure. Each of the electrodes may have a resistance component, so that power consumption required to apply the bias voltage may also increase in proportion to the increasing volume of the electrode. If power required to apply the bias voltage is lowered to reduce power consumption, suppression of the dark current may not be effectively carried out.

Accordingly, the first isolation structure 310 having the first depth D1 over the entire pixel array 110 may not be advantageous in terms of power consumption or dark current suppression performance.

In some embodiments of the disclosed technology, the second isolation structure 320 having a relatively small second depth D2 is disposed in most areas of the pixel array 110 to optimize power consumption and dark current suppression performance, and the first isolation structure 310 having a relatively large first depth D1 may be disposed in a region overlapping the gate DXG of the drive transistor DX to minimize RTS noise of the drive transistor DX. That is, isolation structures are asymmetrically disposed in the pixel array 110, so that performance of the isolation structures can be maximized.

Each of the first depth D1 of the first isolation structure 310 and the second depth D2 of the second isolation structure 320 may be experimentally determined in consideration of power consumption, dark current suppression performance, RTS noise suppression performance, and others.

Although the isolation structures each having a relatively large depth are disposed in an area overlapping the gate DXG of the drive transistor DX has been discussed by way of example, the scope of the disclosed technology is not limited thereto.

In other embodiments of the disclosed technology, an isolation structure having a certain depth is disposed in the overall region of the pixel array 110, and other isolation structures having a depth greater than the certain depth may be asymmetrically disposed in a region in which the channel region needs to be extended or enlarged. Accordingly, the first isolation structure 310 may be disposed to overlap the gate of at least one of the plurality of transistors for processing photocharges generated by the photoelectric conversion element 430.

As is apparent from the above description, the image sensing device based on some implementations of the disclosed technology can improve the signal-to-noise ratio (SNR) of a pixel signal by reducing noise generated in a miniaturized pixel.

Some embodiments of the disclosed technology may provide a variety of effects capable of being directly or indirectly recognized through the above-mentioned patent document.

Although a number of illustrative embodiments have been described, it should be understood that modifications and enhancements to the disclosed embodiments and other embodiments can be devised based on what is described and/or illustrated in this patent document.

What is claimed is:
1. An image sensing device comprising:
    a photoelectric conversion element disposed in a substrate and configured to convert incident light into photocharges indicative of the incident light;
    a plurality of transistors structured to process the photocharges generated by the photoelectric conversion element;
    a first isolation structure disposed adjacent to one side of the photoelectric conversion element and structured to vertically extend from a first surface of the substrate to a first depth; and
    a second isolation structure disposed adjacent to another side of the photoelectric conversion element and structured to extend from the first surface to a second depth,
    wherein the first depth is greater than the second depth,
    wherein the first isolation structure is disposed to overlap a gate electrode of at least one of the plurality of transistors and a channel region disposed under the gate electrode, and
    wherein the channel region is disposed between the first isolation structure and the gate electrode.
2. The image sensing device according to claim 1, wherein the plurality of transistors includes at least one of:
    a transfer transistor configured to transfer the photocharges to a floating diffusion node;
    a reset transistor configured to reset the floating diffusion node;
    a drive transistor configured to generate an electrical signal corresponding to an electric potential of the floating diffusion node; or
    a selection transistor configured to selectively output the electrical signal of the drive transistor as a pixel signal.
3. The image sensing device according to claim 2, wherein:
    a gate electrode of the drive transistor is disposed to overlap the first isolation structure.
4. The image sensing device according to claim 3, wherein:
    a gate electrode of the transfer transistor, a gate electrode of the reset transistor, and a gate electrode of the selection transistor is disposed without overlapping the first isolation structure.
5. The image sensing device according to claim 3, wherein:

a gate electrode of the selection transistor is disposed to overlap the second isolation structure.

6. The image sensing device according to claim 3, wherein:

a length of the first isolation structure is identical to a distance between a first terminal and a second terminal of the drive transistor.

7. The image sensing device according to claim 1, wherein:

a distance between the first isolation structure and a second surface facing the first surface is shorter than a distance between the second isolation structure and the second surface.

8. The image sensing device according to claim 1, wherein:

each of the first isolation structure and the second isolation structure is disposed at a boundary between a pixel including the photoelectric conversion element and another pixel adjacent to the pixel.

9. The image sensing device according to claim 8, wherein:

the first isolation structure and the second isolation structure are disposed to surround the pixel including the photoelectric conversion element.

10. The image sensing device according to claim 1, wherein each of the first isolation structure and the second isolation structure includes:

an electrode configured to receive a bias voltage; and an insulation layer configured to electrically isolate the electrode and an impurity region of the substrate from each other.

11. The image sensing device according to claim 10, wherein:

the bias voltage is a negative voltage.

12. The image sensing device according to claim 1, wherein:

the plurality of transistors includes a n-channel metal-oxide-semiconductor (NMOS) transistor including a gate electrode overlapping the first isolation structure.

* * * * *